United States Patent
Hu et al.

(10) Patent No.: US 11,616,035 B2
(45) Date of Patent: Mar. 28, 2023

(54) SEMICONDUCTOR STRUCTURE

(71) Applicant: United Microelectronics Corp., Hsinchu (TW)

(72) Inventors: Teng-Chuan Hu, Tainan (TW); Chun-Hung Chen, Tainan (TW); Chu-Fu Lin, Kaohsiung (TW)

(73) Assignee: UNITED MICROELECTRONICS CORP., Taipei (TW)

( * ) Notice: Subject to any disclaimer, the term of this patent is extended or adjusted under 35 U.S.C. 154(b) by 0 days.

(21) Appl. No.: 17/397,765

(22) Filed: Aug. 9, 2021

(65) Prior Publication Data

US 2023/0025541 A1    Jan. 26, 2023

(30) Foreign Application Priority Data

Jul. 21, 2021   (TW) .................................. 110126751

(51) Int. Cl.
*H01L 25/065* (2023.01)
*H01L 23/00* (2006.01)
*H01L 25/18* (2023.01)

(52) U.S. Cl.
CPC .......... *H01L 24/08* (2013.01); *H01L 25/0657* (2013.01); *H01L 25/18* (2013.01); *H01L 2224/08145* (2013.01); *H01L 2924/1431* (2013.01); *H01L 2924/1434* (2013.01)

(58) Field of Classification Search
CPC ..... H01L 25/0657; H01L 24/08; H01L 25/18; H01L 2224/08145; H01L 2924/1431; H01L 2924/1434
See application file for complete search history.

(56) References Cited

U.S. PATENT DOCUMENTS

| | | | |
|---|---|---|---|
| 2015/0155163 A1* | 6/2015 | Kim ................... | H01L 29/7843 257/296 |
| 2020/0035683 A1* | 1/2020 | Sharma ............... | H01L 25/0657 |
| 2020/0402903 A1 | 12/2020 | Chen et al. | |
| 2021/0265295 A1* | 8/2021 | Liu ..................... | H01L 25/0657 |

* cited by examiner

*Primary Examiner* — Thanh Y. Tran
(74) *Attorney, Agent, or Firm* — J.C. Patents

(57) ABSTRACT

A semiconductor structure, including a substrate and multiple chips, is provided. The chips are stacked on the substrate. Each of the chips has a first side and a second side opposite to each other. Each of the chips includes a transistor adjacent to the first side and a storage node adjacent to the second side. Two adjacent chips are bonded to each other. The transistor of one of the two adjacent chips is electrically connected to the storage node of the other one of the two adjacent chips to form a memory cell.

20 Claims, 10 Drawing Sheets

SEMICONDUCTOR STRUCTURE

CROSS-REFERENCE TO RELATED APPLICATION

This application claims the priority benefit of Taiwan application serial no. 110126751, filed on Jul. 21, 2021. The entirety of the above-mentioned patent application is hereby incorporated by reference herein and made a part of this specification.

BACKGROUND

Technical Field

The disclosure relates to a semiconductor structure, and particularly relates to a semiconductor structure having a storage node.

Description of Related Art

With the advancement of semiconductor technology, the semiconductor industry continues to shrink the size of the semiconductor element (for example, a memory element). In this way, the footprint of the element may be reduced, thereby improving the utilization rate of the chip area. However, how to further improve the utilization rate of the chip area is the goal of continuous efforts at present.

SUMMARY

The disclosure provides a semiconductor structure, which can improve the utilization rate of the chip area.

The disclosure provides a semiconductor structure including a substrate and multiple chips. The chips are stacked on the substrate. Each chip has a first side and a second side opposite to each other. Each chip includes a transistor adjacent to the first side and a storage node adjacent to the second side. Two adjacent chips are bonded to each other. The transistor of one of the two adjacent chips is electrically connected to the storage node of the other one of the two adjacent chips to form a memory cell.

According to an embodiment of the disclosure, in the semiconductor structure, a bonding method of the two adjacent chips may be a hybrid bonding method.

According to an embodiment of the disclosure, in the semiconductor structure, the first side of one of the two adjacent chips may be bonded to the second side of the other one of the two adjacent chips.

According to an embodiment of the disclosure, the semiconductor structure may further include a routing structure. The routing structure is electrically connected to the transistor.

According to an embodiment of the disclosure, in the semiconductor structure, the transistor and a critical path of the routing structure may be disposed on the same chip.

According to an embodiment of the disclosure, in the semiconductor structure, the transistor and a critical path of the routing structure may be disposed on different chips.

According to an embodiment of the disclosure, in the semiconductor structure, the first side of the chip may face the substrate.

According to an embodiment of the disclosure, in the semiconductor structure, the second side of the chip may face the substrate.

According to an embodiment of the disclosure, the semiconductor structure may further include a logic chip. The logic chip is disposed between the bottommost chip and the substrate.

The disclosure provides another semiconductor structure including a substrate, a first chip set, and a second chip set. The first chip set is disposed on the substrate. The first chip set includes a first chip and a second chip. The first chip includes a first transistor. The second chip is bonded to the first chip. The second chip includes a first storage node. The first transistor of the first chip is electrically connected to the first storage node of the second chip to form a first memory cell. The second chip set is stacked on the first chip set. The second chip set includes a third chip and a fourth chip. The third chip includes a second transistor. The fourth chip is bonded to the third chip. The fourth chip includes a second storage node. The second transistor of the third chip is electrically connected to the second storage node of the fourth chip to form a second memory cell.

According to another embodiment of the disclosure, in the semiconductor structure, a bonding method of the first chip and the second chip may be a hybrid bonding method.

According to another embodiment of the disclosure, in the semiconductor structure, the first chip has a first side. The first transistor is adjacent to the first side. The second chip has a second side. The first storage node is adjacent to the second side. The second side of the second chip may be bonded to the first side of the first chip.

According to another embodiment of the disclosure, the semiconductor structure may further include a routing structure. The routing structure is electrically connected to the first transistor.

According to another embodiment of the disclosure, in the semiconductor structure, a critical path of the routing structure may be disposed on the first chip.

According to another embodiment of the disclosure, in the semiconductor structure, a critical path of the routing structure may be disposed on the second chip.

According to another embodiment of the disclosure, in the semiconductor structure, the third chip may be located between the fourth chip and the first chip set.

According to another embodiment of the disclosure, in the semiconductor structure, the fourth chip may be located between the third chip and the first chip set.

According to another embodiment of the disclosure, in the semiconductor structure, the first chip may be located between the second chip and the substrate.

According to another embodiment of the disclosure, in the semiconductor structure, the second chip may be located between the first chip and the substrate.

According to another embodiment of the disclosure, the semiconductor structure may further include a logic chip. The logic chip is disposed between the first chip set and the substrate.

Based on the above, in the semiconductor structure of an embodiment of the disclosure, the chips are stacked on a substrate. Each chip includes the transistor adjacent to the first side and the storage node adjacent to the second side, and the transistor of one of the two adjacent chips is electrically connected to the storage node of the other one of the two adjacent chips to form the memory cell. In this way, the memory cell may have a smaller footprint, thereby improving the utilization rate of the chip area. In addition, since the transistor and the storage node of the memory cell are located on different chips, the design of the storage node may be more flexible.

The semiconductor structure of another embodiment of the disclosure includes the first chip set and the second chip set stacked on the first chip set. In the first chip set, the first transistor of the first chip is electrically connected to the first storage node of the second chip to form the first memory cell. In the second chip set, the second transistor of the third chip is electrically connected to the second storage node of the fourth chip to form the second memory cell. In this way, the memory cell may have a smaller footprint, thereby improving the utilization rate of the chip area. In addition, in the chip set, since the transistor and the storage node of the memory cell are located on different chips, the design of the storage node may be more flexible.

In order for the features and advantages of the disclosure to be more comprehensible, the following specific embodiments are described in detail in conjunction with the accompanying drawings.

DETAILED DESCRIPTION OF DISCLOSED EMBODIMENTS

Figure 1A:
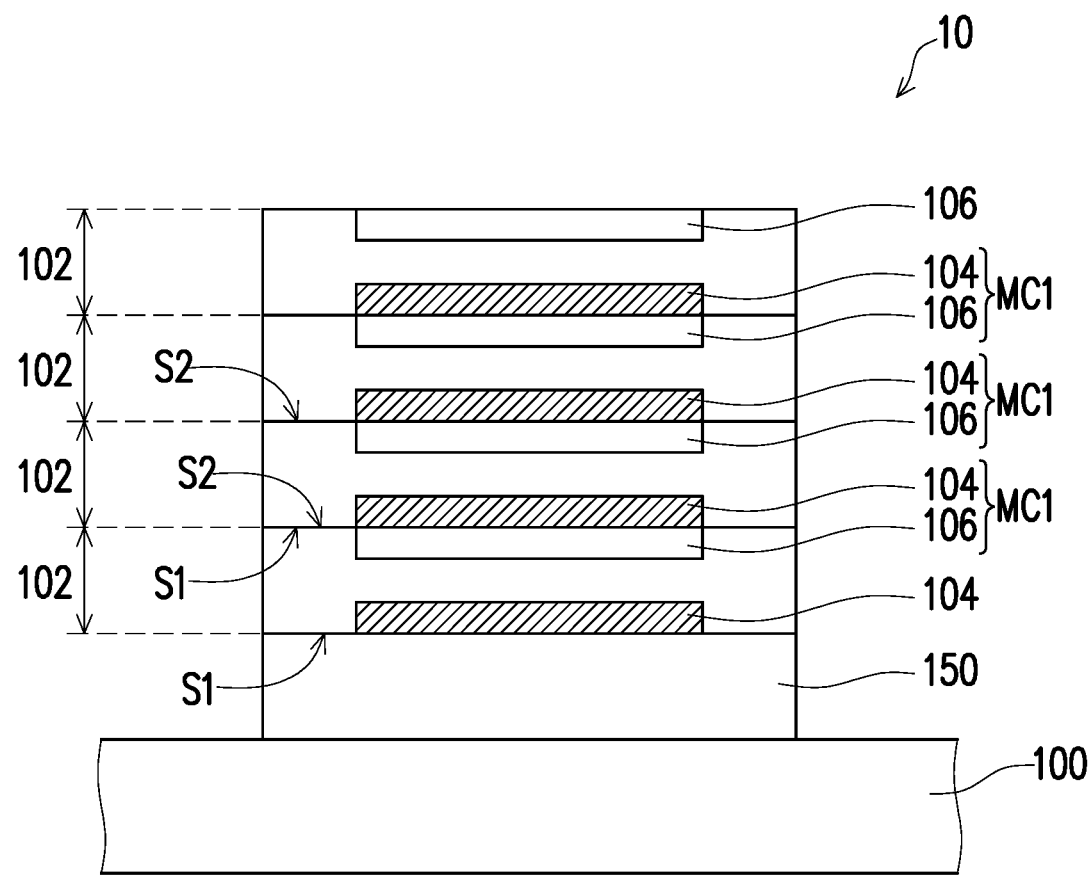
FIG. 1A is a schematic view of a semiconductor structure according to an embodiment of the disclosure.
Figure 1B:
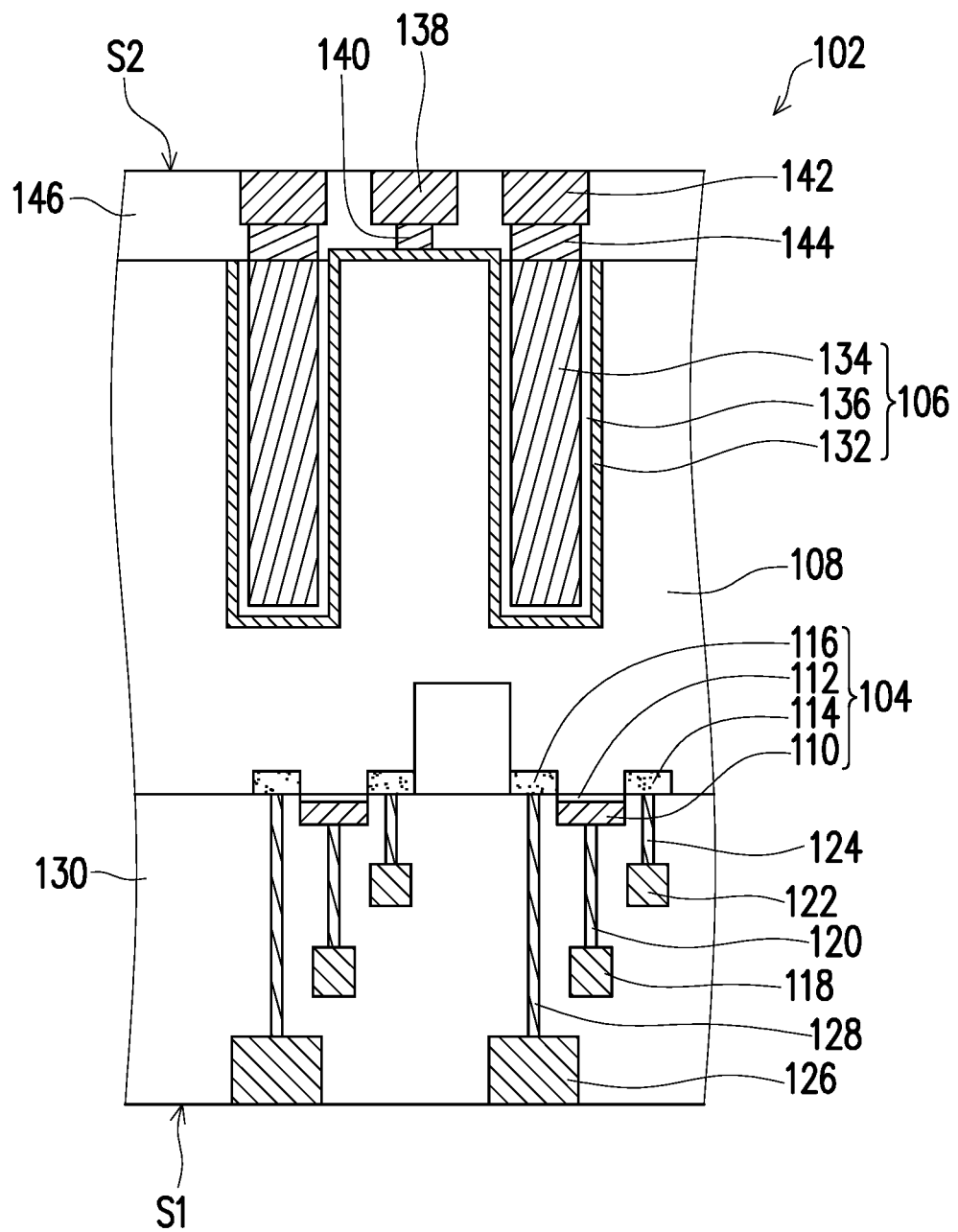
FIG. 1B is a schematic cross-sectional view of a chip in FIG. 1A.
Figure 1C:
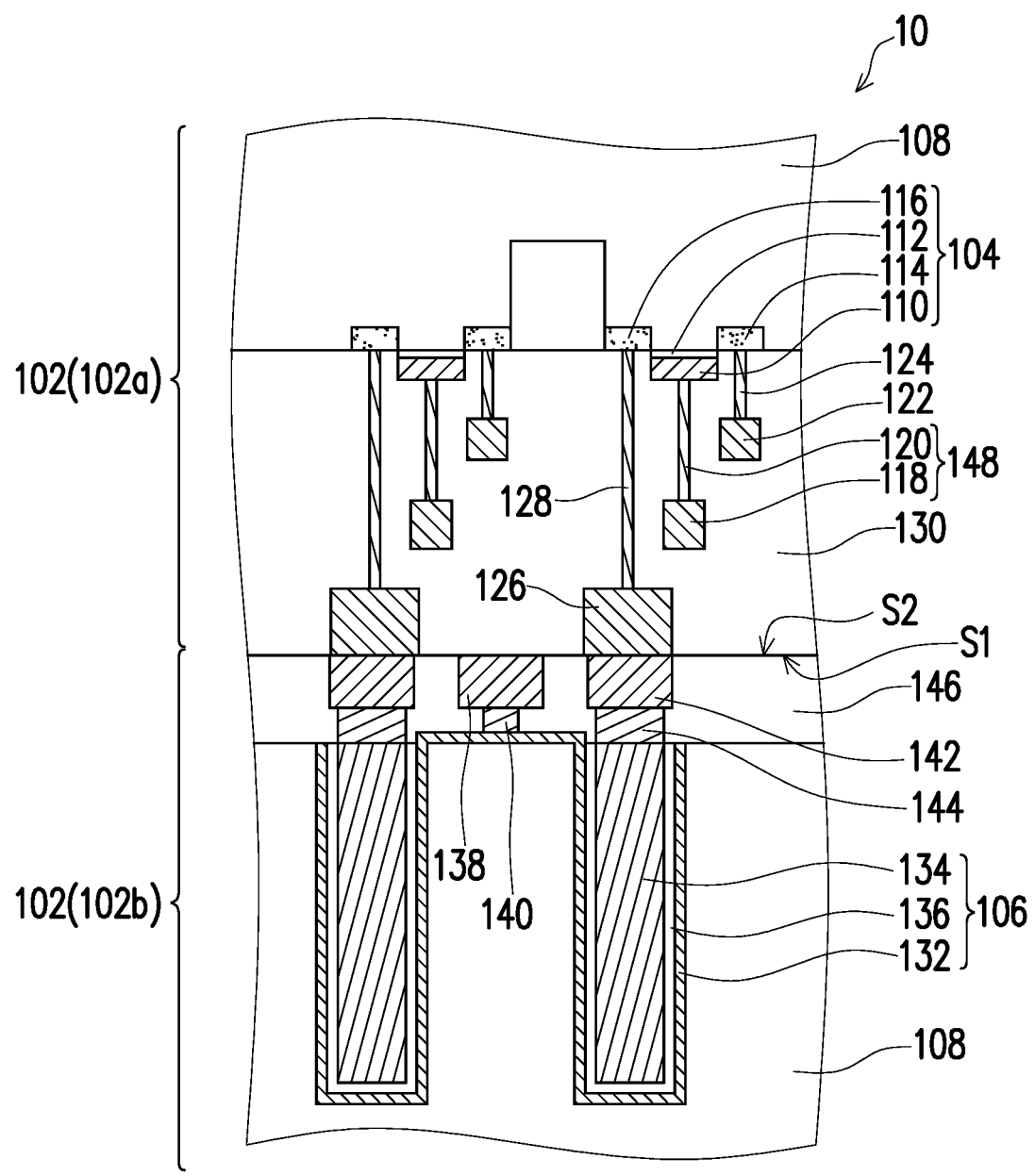
FIG. 1C is a schematic cross-sectional view of a memory cell in FIG. 1A.

FIG. 1A is a schematic view of a semiconductor structure according to an embodiment of the disclosure. FIG. 1B is a schematic cross-sectional view of a chip in FIG. 1A. FIG. 1C is a schematic cross-sectional view of a memory cell in FIG. 1A.

Please refer to FIG. 1A. A semiconductor structure 10 includes a substrate 100 and multiple chips 102. In some embodiments, the semiconductor structure 10 may be a high bandwidth memory (HBM). In some embodiments, the substrate 100 may be a package substrate or an interposer. In FIG. 1A, the number of the chips 102 is exemplified as four, but the disclosure is not limited thereto. As long as the number of the chips 102 is more than two, the same falls within the scope of the disclosure.

The chips 102 are stacked on the substrate 100. The stacking configuration of the chips 100 may be wafer on wafer (WoW) or chip on chip (CoC). Each chip 102 has a side S1 and a side S2 opposite to each other. The side S1 and the side S2 may respectively be one and the other one of a back side and a front side of the chip 102. In the embodiment, the side S1 is exemplified as the back side of the chip 102 and the side S2 is exemplified as the front side of the chip 102, but the disclosure is not limited thereto. In other embodiments, the side S1 may be the front side of the chip 102 and the side S2 may be the back side of the chip 102.

Each chip 102 includes a transistor 104 adjacent to the side S1 and a storage node 106 adjacent to the side S2. The transistor 104 may be a planar transistor, a fin field effect transistor (FinFET), or other suitable transistors. In addition, the storage node 106 may be a capacitor, a resistor, a magnetic tunnel junction (MTJ), a silicon-oxide-nitride-oxide-silicon (SONOS) transistor, or a floating gate transistor.

For example, when the semiconductor structure 10 is a dynamic random access memory (DRAM), the storage node 106 may be a capacitor. When the semiconductor structure 10 is a resistive random access memory (RRAM), the storage node 106 may be a resistor. When the semiconductor structure 10 is a magnetoresistive random access memory (MRAM), the storage node 106 may be an MTJ. When the semiconductor structure 10 is a flash memory, the storage node 106 may be a SONOS transistor or a floating gate transistor.

In some embodiments, the transistors 104 in different chips 102 may be the same type of transistors, but the disclosure is not limited thereto. In other embodiments, the transistors 104 in different chips 102 may be different types of transistors. In some embodiments, the storage nodes 106 in different chips 102 may be the same type of storage nodes, but the disclosure is not limited thereto. In other embodiments, the storage nodes 106 in different chips 102 may be different types of storage nodes.

Figure 2:
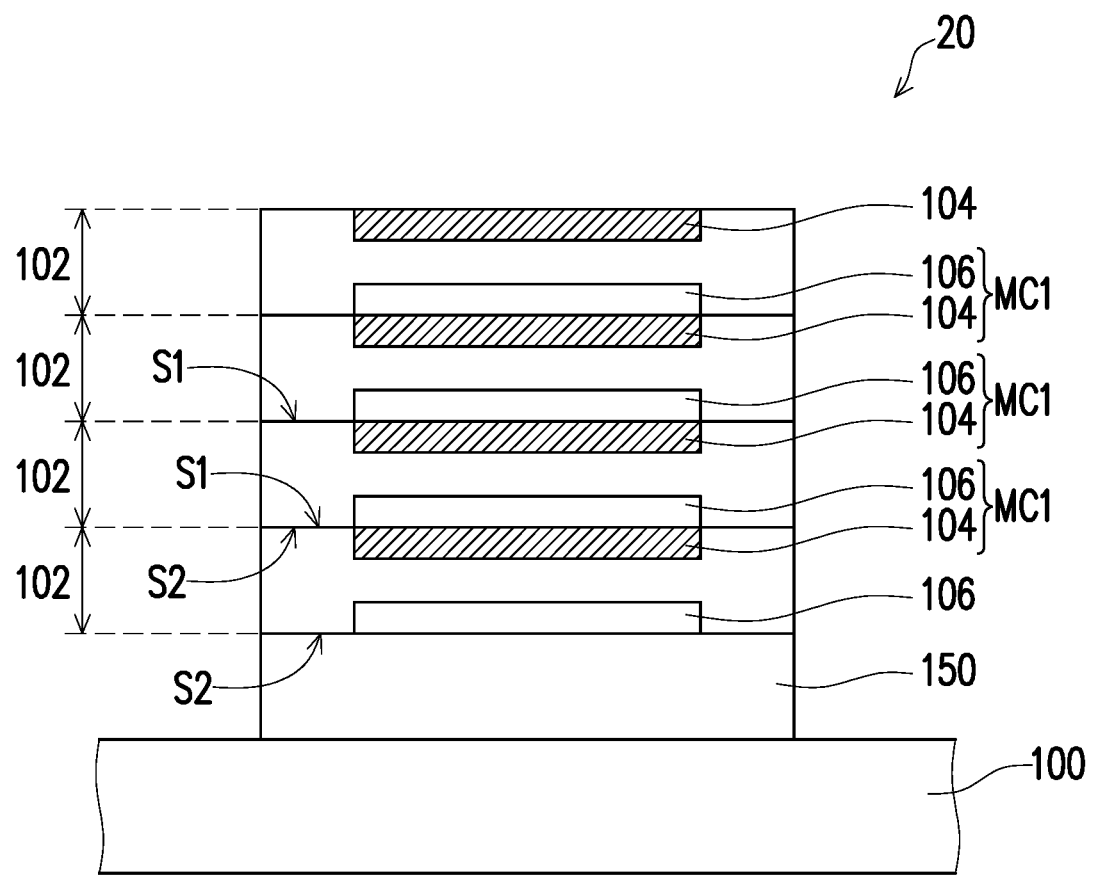
FIG. 2 is a schematic view of a semiconductor structure according to another embodiment of the disclosure.

In the embodiment, the side S1 of the chip 102 may face the substrate 100. That is, in the chip 102, the transistor 104 is closer to the substrate 100 than the storage node 106, but the disclosure is not limited thereto. In other embodiments, the side S2 of the chip 102 may face the substrate 100 (for example, as shown in FIG. 2).

Two adjacent chips 102 are bonded to each other. For example, the side S1 of one of the two adjacent chips 102 may be bonded to the side S2 of the other one of the two adjacent chips 102. The bonding method of the two adjacent chips 102 may be a hybrid bonding method. In addition, compared to a solder bonding method and a microbump bonding method, the hybrid bonding method may have better electrical performance (for example, shorter interconnection, lower resistance, lower energy consumption, low delay, etc.).

The transistor 104 of one of the two adjacent chips 102 is electrically connected to the storage node 106 of the other one of the two adjacent chips 102 to form a memory cell MC1. Hereinafter, the chip 102 and the memory cell MC1 of the embodiment of the disclosure will be described with reference to FIG. 1B and FIG. 1C. In FIG. 1C, the memory cell MC1 is exemplified as a DRAM cell, but the disclosure is not limited thereto. In other embodiments, the memory cell MC1 may be an RRAM cell, an MRAM cell, or a memory cell of a flash memory.

Please refer to FIG. 1B. The chip 102 may include a base 108, the transistor 104, and the storage node 106. The base 108 may be a semiconductor base, such as a silicon base. The transistor 104 is adjacent to the side S1. In the embodiment, the transistor 104 is exemplified as a planar transistor, but the disclosure is not limited thereto. The transistor 104 may include a gate 110, a dielectric layer 112, a doped area 114, and a doped area 116. The gate 110 is disposed on the base 108. The dielectric layer 112 is located between the gate 110 and the base 108. The dielectric layer 112 may be used as a gate dielectric layer. The doped area 114 and the doped area 116 are located in the base 108 on two sides of the gate 110. The doped area 114 and the doped area 116 may be respectively used as one and the other one of a source and a drain. In addition, according to product requirements, the transistor 104 may further include other components such as a spacer (not shown), and the description thereof is omitted here.

In addition, the chip 102 may further include a conducting wire 118, a conducting member 120, a conducting wire 122, a conducting member 124, a bonding pad 126, a conducting member 128, and a dielectric layer 130. The conducting wire 118 is electrically connected to the gate 110. For example, the conducting wire 118 may be electrically connected to the gate 110 by the conducting member 120. The conducting wire 118 may be used as a word line. The conducting wire 122 is electrically connected to the doped area 114. For example, the conducting wire 122 may be electrically connected to the doped area 114 by the conducting member 124. The conducting wire 122 may be used as a bit line. The bonding pad 126 is electrically connected to the doped area 116. For example, the bonding pad 126 may be electrically connected to the doped area 116 by the conducting member 128. The conducting member 120, the conducting member 124, and the conducting member 128 may have a single-layer structure or a multi-layer structure. In addition, the conducting member 120, the conducting member 124, and the conducting member 128 may respectively be a contact, a via, a conducting wire, or a combination thereof. In addition, the conducting wire 118, the conducting member 120, the conducting wire 122, the conducting member 124, the bonding pad 126, and the conducting member 128 may be located in the dielectric layer 130. In some embodiments, the dielectric layer 130 may have a multi-layer structure.

The storage node 106 is adjacent to the side S2. In the embodiment, since the memory cell MC1 (FIG. 1C) is exemplified as a DRAM cell, the storage node 106 may be a capacitor, but the disclosure is not limited thereto. In addition, the capacitor used as the storage node 106 may adopt any capacitor suitable for a DRAM. In the embodiment, the storage node 106 is exemplified as a deep trench capacitor, but the disclosure is not limited thereto.

The storage node 106 may include an electrode 132, an electrode 134, and a dielectric layer 136. The electrode 132 is disposed in the base 108. The electrode 134 is disposed on the electrode 132. The dielectric layer 136 is located between the electrode 132 and the electrode 134. In some embodiments, the chip 102 may further include a dielectric layer (not shown) located between the electrode 132 and the base 108.

In addition, the chip 102 may further include a conducting wire 138, a conducting member 140, a bonding pad 142, a conducting member 144, and a dielectric layer 146. The conducting wire 138 is electrically connected to the electrode 132. For example, the conducting wire 138 may be electrically connected to the electrode 132 by the conducting member 140. The bonding pad 142 is electrically connected to the electrode 134. For example, the bonding pad 142 may be electrically connected to the electrode 134 by the conducting member 144. The conducting member 140 and the conducting member 144 may have a single-layer structure or a multi-layer structure. In addition, the conducting member 140 and the conducting member 144 may respectively be a contact, a via, a conducting wire, or a combination thereof. In addition, the conducting wire 138, the conducting member 140, the bonding pad 142, and the conducting member 144 may be located in the dielectric layer 146. In some embodiments, the dielectric layer 146 may have a multi-layer structure.

In FIG. 1C, only the bonding portion of the two adjacent chips 102 is drawn to simplify the drawing. Please refer to FIG. 1C. The two adjacent chips 102 are bonded to each other. For example, the side S1 of a chip 102a may be bonded to the side S2 of a chip 102b. In some embodiments, the bonding method of the chip 102a and the chip 102b may be the hybrid bonding method. The transistor 104 of the chip 102a is electrically connected to the storage node 106 of the chip 102b to form the memory cell MC1.

For example, when the chip 102a and the chip 102b undergo a bonding process (for example, a hybrid bonding process), the bonding pad 126 of the chip 102a may be bonded to the bonding pad 142 of the chip 102b, and the dielectric layer 130 of the chip 102a may be bonded to the dielectric layer 146 of the chip 102b. In this way, the transistor 104 of the chip 102a may be electrically connected to the storage node 106 of the chip 102b. In some embodiments, the conductivity of the bonding pad 126 and the bonding pad 142 may be better than the conductivity of the solder, thereby enabling the hybrid bonding method to have better electrical performance. For example, when the material of the bonding pad 126 and the bonding pad 142 is copper, the conductivity of the bonding pad 126 and the bonding pad 142 may be better than the conductivity of the solder made of a silver-tin (SnAg) alloy.

Figure 3:
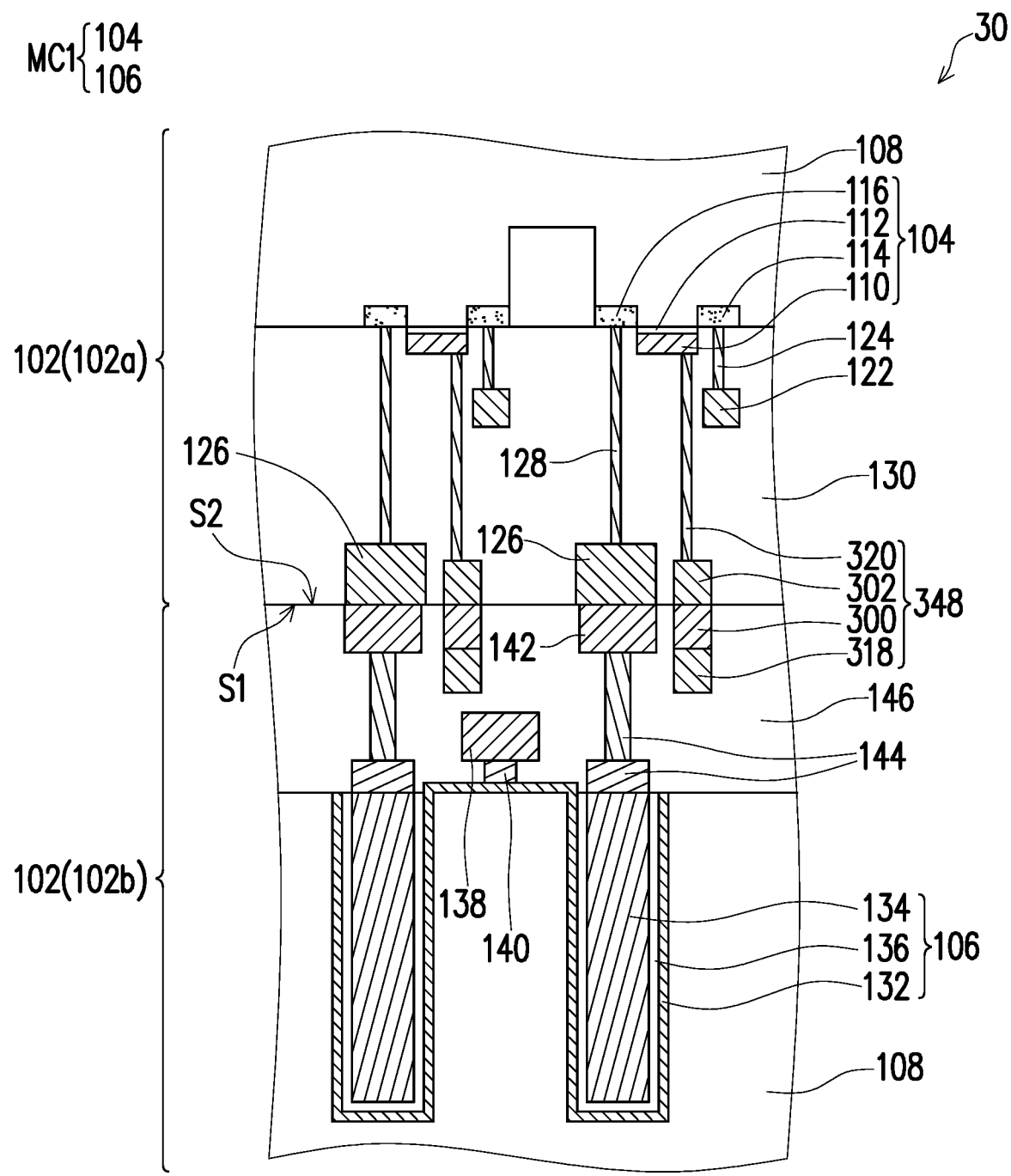
FIG. 3 is a schematic cross-sectional view of a memory cell according to another embodiment of the disclosure.

In addition, the chip 102a may further include a routing structure 148. The routing structure 148 is electrically connected to the transistor 104. In some embodiments, the routing structure 148 may be an interconnection structure of a word line or an interconnection structure of a bit line. In some embodiments, the transistor 104 and a critical path of the routing structure 148 may be disposed on the same chip 102 (as shown in FIG. 1C). In other embodiments, the transistor 104 and the critical path of the routing structure 148 may be disposed on different chips 102 (as shown in FIG. 3).

In the embodiment, as shown in FIG. 1C, the routing structure 148 is exemplified as an interconnection structure of a word line, and the routing structure 148 may be electrically connected to the gate 110 of the transistor 104. For example, the routing structure 148 may include the conducting wire 118 and the conducting member 120. The transistor 104 and the critical path (for example, the conducting wire 118 (word line)) of the routing structure 148 may be disposed on the same chip 102.

Please refer to FIG. 1A. The semiconductor structure 10 may further include a logic chip 150. The logic chip 150 is disposed between the bottommost chip 102 and the substrate 100. The logic chip 150 may be electrically connected to the chip 102 and the substrate 100. In some embodiments, according to product requirements, another required chip (not shown) may be inserted between the bottommost chip 102 and the logic chip 150. In some embodiments, according to product requirements, another required chip (not shown) may be disposed on the topmost chip 102.

In some embodiments, the semiconductor structure 10 may further include a through silicon via (TSV) (not shown). The TSV may be used to perform required electrical connection. For example, the required electrical connection may be performed between the two adjacent chips 102 by the TSV. In some embodiments, the required electrical connection may be performed between the chip 102 and the logic chip 150 by the TSV.

Based on the above embodiment, it can be seen that in the semiconductor structure 10, the chips 102 are stacked on the substrate 100. Each chip 102 includes the transistor 104 adjacent to the side S1 and the storage node 106 adjacent to the side S2, and the transistor 104 of one of the two adjacent chips 102 is electrically connected to the storage node 106 of the other one of the two adjacent chips 102 to form the memory cell MC1. In this way, the memory cell MC1 may have a smaller footprint, thereby improving the utilization rate of the chip area. In addition, since the transistor 104 and the storage node 106 of the memory cell MC1 are located on different chips 102, the design of the storage node 106 may be more flexible.

FIG. 2 is a schematic view of a semiconductor structure according to another embodiment of the disclosure.

Please refer to FIG. 1A and FIG. 2. The difference between a semiconductor structure 20 of FIG. 2 and the semiconductor structure 10 of FIG. 1A is as follows. In the semiconductor structure 20, the side S2 of the chip 102 may face the substrate 100. That is, in the chip 102 of the semiconductor structure 20, the storage node 106 is closer to the substrate 100 than the transistor 104, but the disclosure is not limited thereto. In addition, the same or similar components in the semiconductor structure 20 of FIG. 2 and the semiconductor structure 10 of FIG. 1A are denoted by the same reference numerals, and the description thereof is omitted.

Based on the above embodiment, in the semiconductor structure 20, the chips 102 are stacked on the substrate 100. Each chip 102 includes the transistor 104 adjacent to the side S1 and the storage node 106 adjacent to the side S2, and the transistor 104 of one of the two adjacent chips 102 is electrically connected to the storage node 106 of the other one of the two adjacent chips 102 to form the memory cell MC1. In this way, the memory cell MC1 may have a smaller footprint, thereby improving the utilization rate of the chip area. In addition, since the transistor 104 and the storage node 106 of the memory cell MC1 are located on different chips 102, the design of the storage node 106 may be more flexible.

FIG. 3 is a schematic cross-sectional view of a memory cell according to another embodiment of the disclosure.

Please refer to FIG. 1C and FIG. 3. The difference between a semiconductor structure 30 of FIG. 3 and the semiconductor structure 10 of FIG. 1A is as follows. In the semiconductor structure 30, the transistor 104 and a critical path of the routing structure 348 may be disposed on different chips 102, so that the layout design of the routing structure 348 may be more flexible. For example, the width or the thickness of the critical path (for example, a word line or a bit line) of the routing structure 348 may be increased, thereby effectively reducing the resistance-capacitance (RC) delay. The routing structure 348 is electrically connected to the transistor 104. In some embodiments, the routing structure 348 may be an interconnection structure of a word line or an interconnection structure of a bit line.

In the embodiment, as shown in FIG. 3, the routing structure 348 is exemplified as an interconnection structure of a word line. For example, the routing structure 348 may include a conducting wire 318, a bonding pad 300, a bonding pad 302, and a conducting member 320. The conducting wire 318 may be electrically connected to the gate 110 by the bonding pad 300, the bonding pad 302, and the conducting member 320. The conducting wire 318 and the bonding pad 300 are located in the dielectric layer 146 of the chip 102b, and the bonding pad 302 and the conducting member 320 are located in the dielectric layer 130 of the chip 102a. That is, the transistor 104 and the critical path (for example, the conducting wire 318 (word line)) of the routing structure 348 may be disposed on different chips 102.

In addition, the same or similar components in the semiconductor structure 30 of FIG. 3 and the semiconductor structure 10 of FIG. 1C are denoted by the same reference numerals, and the description thereof is omitted.

Based on the above embodiment, in the semiconductor structure 30, the chips 102 are stacked on the substrate 100. Each chip 102 includes the transistor 104 adjacent to the side S1 and the storage node 106 adjacent to the side S2, and the transistor 104 of one of the two adjacent chips 102 is electrically connected to the storage node 106 of the other one of the two adjacent chips 102 to form the memory cell MC1. In this way, the memory cell MC1 may have a smaller footprint, thereby improving the utilization rate of the chip area. In addition, since the transistor 104 and the storage node 106 of the memory cell MC1 are located on different chips 102, the design of the storage node 106 may be more flexible. In addition, since the transistor 104 and the critical path of the routing structure 348 may be disposed on different chips 102, the layout design of the routing structure 348 may be more flexible.

Figure 4A:
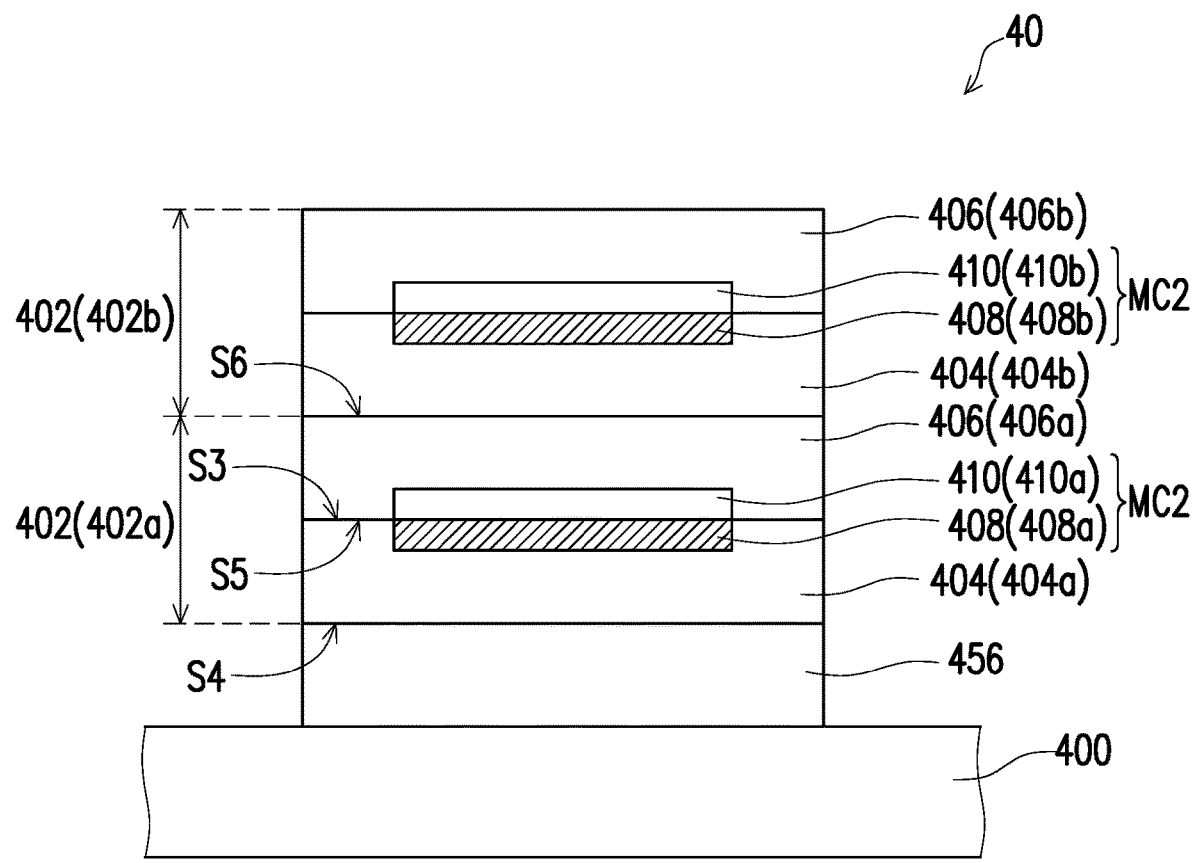
FIG. 4A is a schematic view of a semiconductor structure according to another embodiment of the disclosure.
Figure 4B:
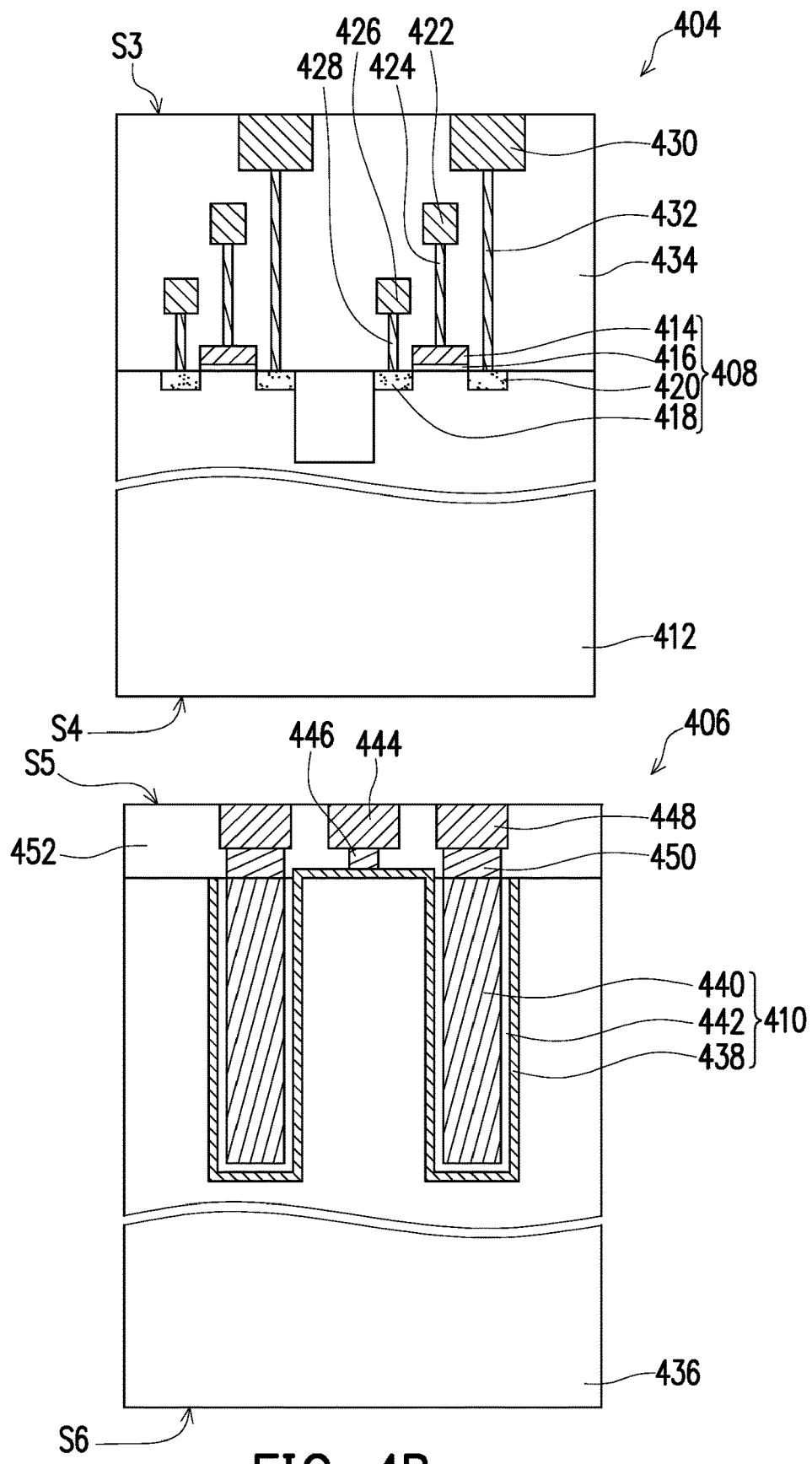
FIG. 4B is a schematic cross-sectional view of a chip in FIG. 4A.
Figure 4C:
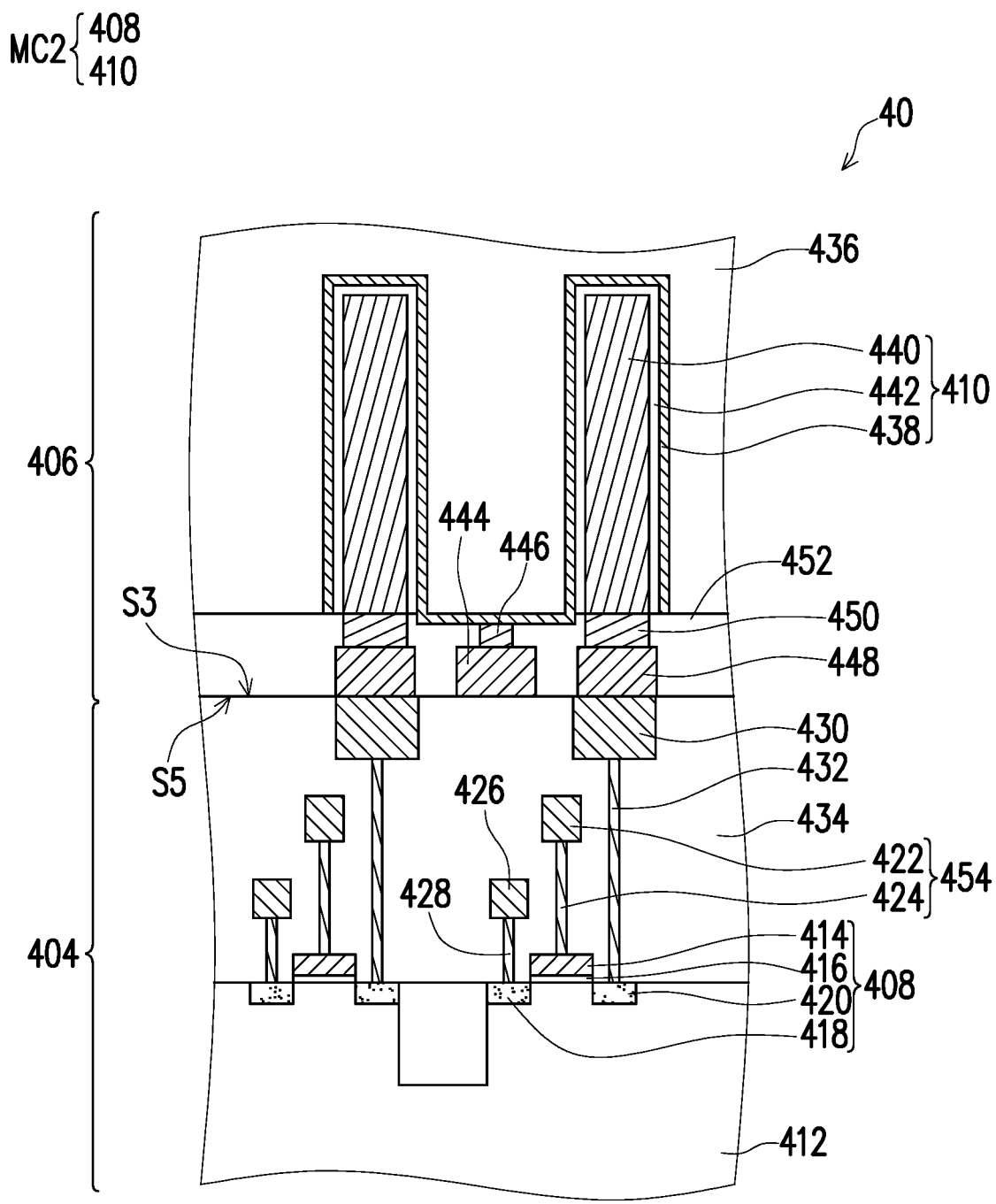
FIG. 4C is a schematic cross-sectional view of a memory cell in FIG. 4A.

FIG. 4A is a schematic view of a semiconductor structure according to another embodiment of the disclosure. FIG. 4B is a schematic cross-sectional view of a chip in FIG. 4A. FIG. 4C is a schematic cross-sectional view of a memory cell in FIG. 4A.

Please refer to FIG. 4A. A semiconductor structure 40 includes a substrate 400 and multiple chip sets 402. The chip set 402 is disposed on the substrate 400. In some embodiments, the semiconductor structure 40 may be a high-bandwidth memory. In some embodiments, the substrate 400 may be a package substrate or an interposer. In FIG. 4A, the number of the chip sets 402 is exemplified as two, but the disclosure is not limited thereto. As long as the number of the chip sets 402 is more than two, the same falls within the scope of the disclosure.

The chip set 402 includes a chip 404 and a chip 406. The stacking configuration of the chip 404 and the chip 406 may be WoW or CoC. The chip 404 has a side S3 and a side S4 opposite to each other. The side S3 and the side S4 may respectively be one and the other one of a front side and a back side of the chip 404. The chip 406 has a side S5 and a side S6 opposite to each other. The side S5 and the side S6 may respectively be one and the other one of a front side and a back side of the chip 406.

The chip 404 includes a transistor 408. The transistor 408 is adjacent to the side S3. The transistor 408 may be a planar transistor, a FinFET, or other suitable transistors. The chip 406 includes a storage node 410. The storage node 410 is adjacent to the side S5. The storage node 410 may be a capacitor, a resistor, an MTJ, a SONOS transistor, or a floating gate transistor.

For example, when the semiconductor structure 40 is a DRAM, the storage node 410 may be a capacitor. When the semiconductor structure 10 is an RRAM, the storage node 410 may be a resistor. When the semiconductor structure 40 is an MRAM, the storage node 410 may be an MTJ. When the semiconductor structure 40 is a flash memory, the storage node 106 may be a SONOS transistor or a floating gate transistor.

In some embodiments, the transistors 408 in different chip sets 402 may be the same type of transistors, but the disclosure is not limited thereto. In other embodiments, the transistors 408 in different chip sets 402 may be different types of transistors. In some embodiments, the storage nodes 410 in different chip sets 402 may be the same type of storage nodes, but the disclosure is not limited thereto. In other embodiments, the storage nodes 410 in different chip sets 402 may be different types of storage nodes.

The chip 406 is bonded to the chip 404. For example, the side S5 of the chip 406 may be bonded to the side S3 of the chip 404. The bonding method of the chip 404 and the chip 406 may be the hybrid bonding method. In addition, compared to the solder bonding method and the microbump bonding method, the hybrid bonding method may have better electrical performance (for example, shorter interconnection, lower resistance, lower energy consumption, low delay, etc.).

The transistor 408 of the chip 404 is electrically connected to the storage node 410 of the chip 406 to form a memory cell MC2. Hereinafter, the chip 404, the chip 406, and the memory cell MC2 of the embodiment of the disclosure will be described with reference to FIG. 4B and FIG. 4C. In FIG. 4C, the memory cell MC2 is exemplified as a DRAM cell, but the disclosure is not limited thereto. In other embodiments, the memory cell M2 may be an RRAM cell, an MRAM cell, or a memory cell of a flash memory.

Please refer to FIG. 4B. The chip 404 may include a base 412 and the transistor 408. The base 412 may be a semiconductor base, such as a silicon base. The transistor 408 is adjacent to the side S3. In the embodiment, the transistor 408 is exemplified as a planar transistor, but the disclosure is not limited thereto. The transistor 408 may include a gate 414, a dielectric layer 416, a doped area 418, and a doped area 420. The gate 414 is disposed on the base 412. The dielectric layer 416 is located between the gate 414 and the base 412. The dielectric layer 416 may be used as a gate dielectric layer. The doped area 418 and the doped area 420 are located in the base 412 on two sides of the gate 414. The doped area 418 and the doped area 420 may be respectively used as one and the other one of a source and a drain. In addition, according to product requirements, the transistor 404 may further include other components such as a spacer (not shown), and the description thereof is omitted here.

In addition, the chip 404 may further include a conducting wire 422, a conducting member 424, a conducting wire 426, a conducting member 428, a bonding pad 430, a conducting member 432, and a dielectric layer 434. The conducting wire 422 is electrically connected to the gate 414. For example, the conducting wire 422 may be electrically connected to the gate 414 by the conducting member 424. The conducting wire 422 may be used as a word line. The conducting wire 426 is electrically connected to the doped area 418. For example, the conducting wire 426 may be electrically connected to the doped area 418 by the conducting member 428. The conducting wire 426 may be used as a bit line. The bonding pad 430 is electrically connected to the doped area 420. For example, the bonding pad 430 may be electrically connected to the doped area 420 by the conducting member 432. The conducting member 424, the conducting member 428, and the conducting member 432 may have a single-layer structure or a multi-layer structure. In addition, the conducting member 424, the conducting member 428, and the conducting member 432 may respectively be a contact, a via, a conducting wire, or a combination thereof. In addition, the conducting wire 422, the conducting member 424, the conducting wire 426, the conducting member 428, the bonding pad 430, and the conducting member 432 may be located in the dielectric layer 434. In some embodiments, the dielectric layer 434 may have a multi-layer structure.

The chip 406 may include a base 436 and a storage node 410. The base 436 may be a semiconductor base, such as a silicon base. The storage node 410 is adjacent to the side S5. In the embodiment, since the memory cell MC2 (FIG. 4C) is exemplified as a DRAM cell, the storage node 410 may be a capacitor, but the disclosure is not limited thereto. In addition, the capacitor used as the storage node 410 may adopt any capacitor suitable for a DRAM. In the embodiment, the storage node 410 is exemplified as a deep trench capacitor, but the disclosure is not limited thereto.

The storage node 410 may include an electrode 438, an electrode 440, and a dielectric layer 442. The electrode 438 is disposed in the base 436. The electrode 440 is disposed on the electrode 438. The dielectric layer 442 is located between the electrode 438 and the electrode 440. In some embodiments, the chip 406 may further include a dielectric layer (not shown) located between the electrode 438 and the base 436.

In addition, the chip 406 may further include a conducting wire 444, a conducting member 446, a bonding pad 448, a conducting member 450, and a dielectric layer 452. The conducting wire 444 is electrically connected to the electrode 438. For example, the conducting wire 444 may be electrically connected to the electrode 438 by the conducting member 446. The bonding pad 448 is electrically connected to the electrode 440. For example, the bonding pad 448 may be electrically connected to the electrode 440 by the conducting member 450. The conducting member 446 and the conducting member 450 may have a single-layer structure or a multi-layer structure. In addition, the conducting member 446 and the conducting member 450 may respectively be a contact, a via, a conducting wire, or a combination thereof. In addition, the conducting wire 444, the conducting member 446, the bonding pad 448, and the conducting member 450 may be located in the dielectric layer 452. In some embodiments, the dielectric layer 452 may have a multi-layer structure.

In FIG. 4C, a portion of the base is omitted to simplify the drawing. Please refer to FIG. 4C. The chip 404 and the chip 406 are bonded to each other. For example, the side S3 of the chip 404 may be bonded to the side S5 of the chip 406. In some embodiments, the bonding method of the chip 404 and the chip 406 may be the hybrid bonding method. The transistor 408 of the chip 404 is electrically connected to the storage node 410 of the chip 406 to form the memory cell MC2.

For example, when the chip 404 and the chip 406 undergo the bonding process (for example, the hybrid bonding process), the bonding pad 430 of the chip 404 may be bonded to the bonding pad 448 of the chip 406, and the dielectric layer 434 of the chip 404 may be bonded to the dielectric layer 452 of the chip 406. In this way, the transistor 408 of the chip 404 may be electrically connected to the storage node 410 of the chip 406. In some embodiments, the conductivity of the bonding pad 430 and the bonding pad 448 may be better than the conductivity of the solder, thereby enabling the hybrid bonding method to have better electrical performance. For example, when the material of the bonding pad 430 and the bonding pad 448 is copper, the conductivity of the bonding pad 430 and the bonding pad 448 may be better than the conductivity of the solder made of a SnAg alloy.

In addition, the chip 404 may further include a routing structure 454. The routing structure 454 is electrically connected to the transistor 408. In some embodiments, the routing structure 454 may be an interconnection structure of a word line or an interconnection structure of a bit line. In some embodiments, a critical path of the routing structure 454 may be disposed on the chip 404. That is, the transistor 408 and the critical path of the routing structure 454 may be disposed on the same chip 404, but the disclosure is not limited thereto.

In the embodiment, as shown in FIG. 4C, the routing structure 454 is exemplified as an interconnection structure of a word line, and the routing structure 454 may be electrically connected to the gate 414 of the transistor 408. For example, the routing structure 454 may include the conducting wire 422 and the conducting member 424. The transistor 408 and the critical path (for example, the conducting wire 422 (word line)) of the routing structure 454 may be disposed on the same chip 404.

In other embodiments, the critical path of the routing structure 454 may be disposed on the chip 406 (not shown). That is, the transistor 408 and the critical path of the routing structure 454 may be disposed on different chips, so that the layout design of the routing structure 454 may be more flexible. In addition, regarding the related content of disposing the transistor 408 and the critical path of the routing structure 454 on different chips, please refer to the description of the routing structure 348 in FIG. 3, and the description thereof is omitted here.

Figure 5:
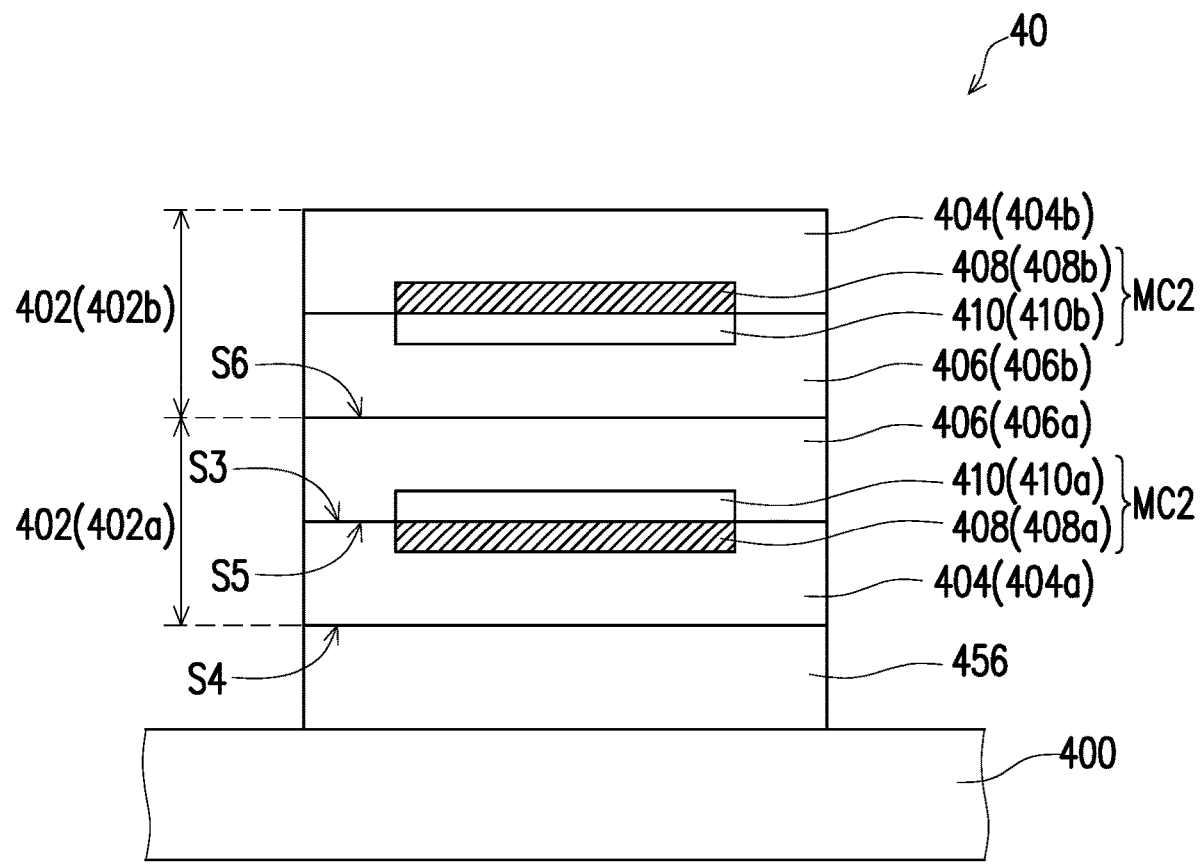
FIG. 5 is a schematic view of a semiconductor structure according to another embodiment of the disclosure.
Figure 6:
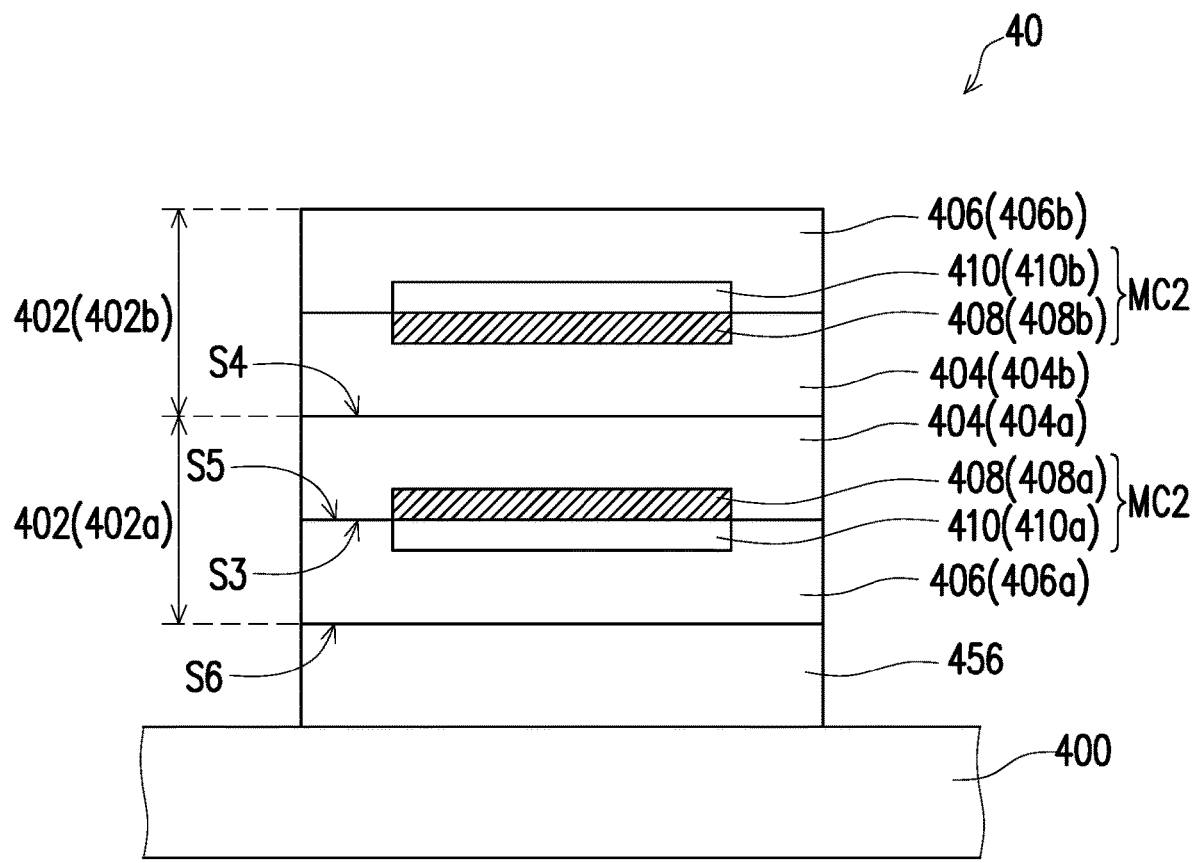
FIG. 6 is a schematic view of a semiconductor structure according to another embodiment of the disclosure.

Please refer to FIG. 4A. A chip set 402b is stacked on a chip set 402a. The chip set 402a may include a chip 404a and a chip 406a bonded to each other. The chip set 402b may include a chip 404b and a chip 406b bonded to each other. In the embodiment, the chip 404b may be located between the chip 406b and the chip set 402a (as shown in FIG. 4A), but the disclosure is not limited thereto. In other embodiments, as shown in FIG. 5, the chip 406b may be located between the chip 404b and the chip set 402a, that is, the positions of the chip 404b and the chip 406b in FIG. 4A may be exchanged. In the embodiment, the chip 404a may be located between the chip 406a and the substrate 400 (as shown in FIG. 4A), but the disclosure is not limited thereto. In other embodiments, as shown in FIG. 6, the chip 406a may be located between the chip 404a and the substrate 400, that is, the positions of the chip 404a and the chip 406a in FIG. 4A may be exchanged. Based on the above, the chip position in the chip set 402a and/or the chip position in the chip set 402b may be adjusted according to product requirements. As long as the chip set 402b is stacked on the chip set 402a, the chip 404a and the chip 406a are bonded to each other, and the chip 404b and the chip 406b are bonded to each other, the same falls within the scope of the disclosure.

Please refer to FIG. 4A. The semiconductor structure 40 may further include a logic chip 456. The logic chip 456 is disposed between the chip set 402a and the substrate 400. The logic chip 456 may be electrically connected to the chip set 402a and the substrate 400. In some embodiments, another required chip (not shown) may be inserted between the chip set 402a and the logic chip 456 according to product requirements. In some embodiments, another required chip (not shown) may be disposed on the chip set 402b according to product requirements.

In some embodiments, the semiconductor structure 40 may further include a TSV (not shown). The TSV may be used to perform required electrical connection. For example, the required electrical connection between the chip 404 and the chip 406 may be performed by the TSV. In some embodiments, the required electrical connection between the chip 404a and the logic chip 456 may be performed by the TSV.

Based on the above embodiment, it can be seen that in the semiconductor structure 40, the chip sets 402 (for example, the chip set 402a and the chip set 402b) are stacked on the substrate 400. In the chip set 402, the transistor 408 of the chip 404 is electrically connected to the storage node 410 of the chip 406 to form the memory cell MC2. In this way, the memory cell MC2 may have a smaller footprint, thereby improving the utilization rate of the chip area. In addition, in the chip set 402, since the transistor 408 and the storage node 410 of the memory cell are located on different chips, the design of the storage node 410 may be more flexible.

In summary, in the semiconductor structure of the above embodiments, since the chips are stacked on the substrate, and the transistor of one of the two adjacent chips is electrically connected to the storage node of the other one of the two adjacent chips to form a memory cell, the utilization rate of the chip area may be improved, and the design of the storage node may be more flexible.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be determined by the scope of the appended claims.

What is claimed is:

1. A semiconductor structure, comprising:
a substrate; and
a plurality of chips, stacked on the substrate, wherein
each of the plurality of chips has a first side and a second side opposite to each other and comprises a transistor adjacent to the first side and a storage node adjacent to the second side,
two adjacent chips of the plurality of chips are bonded to each other, and
the transistor of one of the two adjacent chips is electrically connected to the storage node of other one of the two adjacent chips to form a memory cell.

2. The semiconductor structure according to claim 1, wherein a bonding method of the two adjacent chips comprises a hybrid bonding method.

3. The semiconductor structure according to claim 1, wherein the first side of one of the two adjacent chips is bonded to the second side of other one of the two adjacent chips.

4. The semiconductor structure according to claim 1, further comprising:
a routing structure, electrically connected to the transistor.

5. The semiconductor structure according to claim 4, wherein the transistor and a critical path of the routing structure are disposed on a same chip.

6. The semiconductor structure according to claim 4, wherein the transistor and a critical path of the routing structure are disposed on different chips.

7. The semiconductor structure according to claim 1, wherein the first side of the chip each of the plurality of chips faces the substrate.

8. The semiconductor structure according to claim 1, wherein the second side of each of the plurality of chips faces the substrate.

9. The semiconductor structure according to claim 1, further comprising:
a logic chip, disposed between a bottommost chip of the plurality of chips and the substrate.

10. A semiconductor structure, comprising:
a substrate; and
a first chip set, disposed on the substrate and comprising:
a first chip, comprising a first transistor; and
a second chip, bonded to the first chip and comprising a first storage node, wherein the first transistor of the first chip is electrically connected to the first storage node of the second chip to form a first memory cell; and a second chip set, stacked on the first chip set and comprising:

a third chip, comprising a second transistor; and a fourth chip, bonded to the third chip and comprising a second storage node, wherein the second transistor of the third chip is electrically connected to the second storage node of the fourth chip to form a second memory cell, the first chip further comprises a first bonding pad electrically connected to the first transistor, the second chip further comprises a second bonding pad electrically connected to the first storage node and bonded to the first bonding pad, the third chip further comprises a third bonding pad electrically connected to the second transistor, and the fourth chip further comprises a fourth bonding pad electrically connected to the second storage node and bonded to the third bonding pad.

11. The semiconductor structure according to claim 10, wherein a bonding method of the first chip and the second chip comprises a hybrid bonding method.

12. The semiconductor structure according to claim 10, wherein the first chip has a first side, the first transistor is adjacent to the first side, the second chip has a second side, the first storage node is adjacent to the second side, and the second side of the second chip is bonded to the first side of the first chip.

13. The semiconductor structure according to claim 10, further comprising:

a routing structure, electrically connected to the first transistor.

14. The semiconductor structure according to claim 13, wherein a critical path of the routing structure is disposed on the first chip.

15. The semiconductor structure according to claim 13, wherein a critical path of the routing structure is disposed on the second chip.

16. The semiconductor structure according to claim 10, wherein the third chip is located between the fourth chip and the first chip set.

17. The semiconductor structure according to claim 10, wherein the fourth chip is located between the third chip and the first chip set.

18. The semiconductor structure according to claim 10, wherein the first chip is located between the second chip and the substrate.

19. The semiconductor structure according to claim 10, wherein the second chip is located between the first chip and the substrate.

20. The semiconductor structure according to claim 10, further comprising:

a logic chip, disposed between the first chip set and the substrate.

* * * * *